United States Patent
Yamashita et al.

(10) Patent No.: US 9,099,521 B2
(45) Date of Patent: Aug. 4, 2015

(54) REVERSE CONDUCTING IGBT

(71) Applicants: Yusuke Yamashita, Nagoya (JP); Satoru Machida, Nagakute (JP); Jun Saito, Nagoya (JP)

(72) Inventors: Yusuke Yamashita, Nagoya (JP); Satoru Machida, Nagakute (JP); Jun Saito, Nagoya (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 10 days.

(21) Appl. No.: 14/182,923

(22) Filed: Feb. 18, 2014

(65) Prior Publication Data
US 2014/0252408 A1    Sep. 11, 2014

(30) Foreign Application Priority Data
Mar. 6, 2013 (JP) .................... 2013-044610

(51) Int. Cl.
H01L 29/739 (2006.01)
H01L 29/861 (2006.01)
H01L 29/08 (2006.01)
H01L 29/10 (2006.01)

(52) U.S. Cl.
CPC ........ *H01L 29/7395* (2013.01); *H01L 29/0834* (2013.01); *H01L 29/1095* (2013.01); *H01L 29/7397* (2013.01); *H01L 29/8611* (2013.01)

(58) Field of Classification Search
CPC ............ H01L 29/7397; H01L 29/7395; H01L 29/7393
See application file for complete search history.

(56) References Cited

U.S. PATENT DOCUMENTS

| 2012/0181575 A1* | 7/2012 | Pfirsch .......................... 257/139 |
| 2014/0070270 A1* | 3/2014 | Yoshida et al. ............... 257/140 |

FOREIGN PATENT DOCUMENTS

| JP | A-2008-72848 | 3/2008 |
| JP | A-2009-268054 | 11/2009 |

* cited by examiner

*Primary Examiner* — Whitney T Moore
(74) *Attorney, Agent, or Firm* — Oliff PLC

(57) ABSTRACT

A reverse conducting IGBT that includes an insulated gate; a semiconductor layer having a first conductivity type drift region, a second conductivity type body region, a first conductivity type emitter region, and a second conductivity type intermediate region; and an emitter electrode provided on a surface of the semiconductor layer. The first conductivity type drift region of the semiconductor layer contacts the insulated gate. The second conductivity type body region of the semiconductor layer is provided on the drift region and contacts the insulated gate. The first conductivity type emitter region of the semiconductor layer is provided on the body region and contacts the insulated gate. The second conductivity type intermediate region of the semiconductor layer is provided on the emitter region and is interposed between the emitter region and the emitter electrode.

7 Claims, 6 Drawing Sheets

REVERSE CONDUCTING IGBT

INCORPORATION BY REFERENCE

The disclosure of Japanese Patent Application No. 2013-044610 filed on Mar. 6, 2013 including the specification, drawings and abstract is incorporated herein by reference in its entirety.

BACKGROUND OF THE INVENTION

1. Field of the Invention

The invention relates to a reverse conducting IGBT (Reverse Conducting Insulated Gate Bipolar Transistor).

2. Description of Related Art

A reverse conducting IGBT that has an IGBT structure and in which a diode structure is integrated into a semiconductor layer has been developed. As shown in FIG. 5, this kind of reverse conducting IGBT is often used for six transistors Tr1 to Tr6 that form a three phase inverter. The diode structure operates as a Free Wheeling Diode (FWD).

FIG. 6 is a view of a timing chart of a gate signal input to each of the transistors Tr1 to Tr6. The phases of the gate signals of the upper and lower transistors are offset approximately 180 degrees, the phases of the gate signals of the transistors of a U-phase and a V-phase are offset approximately 120 degrees, and the phases of the gate signals of the transistors of the V-phase and a W-phase are offset approximately 120 degrees.

For example, at time t1, current flows through the IGBT structure of each of the transistors Tr1, Tr3, and Tr6. At time t3, current flows through the IGBT structure of each of the transistors Tr2, Tr3, and Tr6. Here, at time t2 that is a transition from time t1 to time t3, return current flows through the diode structure of the transistor Tr2, and the gate signal of the transistor Tr2 is on. In this way, with a three phase inverter, when return current flows through the diode structure, there is a mode in which gate voltage is applied to a corresponding gate.

When gate voltage is applied to the gate, an n-type drift region and an n-type emitter region are connected via a channel. Both the n-type emitter region and a p-type body region are connected to a common emitter electrode. Therefore, when gate voltage is applied to the gate, it becomes difficult for sufficient voltage to be applied in the forward direction of the diode structure formed by the p-type body region and the n-type drift region. This phenomenon is referred to as gate interference, and forward voltage of the diode structure fluctuates largely depending on whether the gate signal is on or off, as shown in FIG. 7.

To counter such gate interference, Japanese Patent Application Publication No. 2008-72848 (JP 2008-72848 A) proposes technology that detects return current flowing through the diode structure, and provides an external circuit configured to interrupt the gate signal.

However, providing an external circuit as described in JP 2008-72848 A complicates control and increases costs.

SUMMARY OF THE INVENTION

The invention alleviates gate interference by ingeniously changing the internal structure of a reverse conducting IGBT.

One aspect of the invention relates to a reverse conducting IGBT that includes an insulated gate; a semiconductor layer having a first conductivity type drift region, a second conductivity type body region, a first conductivity type emitter region, and a second conductivity type intermediate region; and an emitter electrode provided on a surface of the semiconductor layer. The first conductivity type drift region of the semiconductor layer contacts the insulated gate. The second conductivity type body region of the semiconductor layer is provided on the drift region and contacts the insulated gate. The first conductivity type emitter region of the semiconductor layer is provided on the body region and contacts the insulated gate. The second conductivity type intermediate region of the semiconductor layer is provided on the emitter region and is interposed between the emitter region and the emitter electrode.

With the reverse conducting IGBT described above, a diode is formed between the second conductivity type intermediate region and the first conductivity type emitter region. The necessary forward voltage is applied to the diode structure embedded between the body region and the drift region by a voltage drop of this diode, so gate interference is able to be inhibited.

BRIEF DESCRIPTION OF THE DRAWINGS

Features, advantages, and technical and industrial significance of exemplary embodiments of the invention will be described below with reference to the accompanying drawings, in which like numerals denote like elements, and wherein.

DETAILED DESCRIPTION OF EMBODIMENTS

Hereinafter, example embodiments of the invention will be described with reference to the accompanying drawings. Each of the matters described below has technical utility independently. (1) A reverse conducting IGBT that has an IGBT structure and in which a diode structure is integrated into a semiconductor layer is described. (2) The reverse conducting IGBT has an intermediate region that is provided on an emitter region and is interposed between the emitter region and an emitter electrode. (3) The intermediate region may be configured to punch through when the intermediate region and the emitter region are inversely-biased. According to this mode, when the IGBT structure is on, the intermediate region punches through, so the diode between the intermediate region and the emitter region disappears. Therefore, according to this mode, the IGBT structure is able to better be turned on. (4) An impurity concentration of the intermediate region may be lower than an impurity concentration of the emitter region. According to this mode, the intermediate region is easy to punch through when the intermediate region and the emitter region are inversely-biased. (5) The semiconductor layer of the reverse conducting IGBT may also include a second conductivity type collector region provided on one portion below the drift region, and a first conductivity type cathode region provided on another portion below the drift region. Here, the layout of the collector region and the cathode region provided below the drift region is not particularly limited. In one example, the layout may be such that, when the semiconductor layer is viewed at a specific cross-section, the collector region and the cathode region are alternately arranged. (6) In the reverse conducting IGBT, when the area where the collector region is present is an IGBT area and the area where the cathode region is present is a diode area when the semiconductor layer is viewed from above, the intermediate region may be provided in at least the diode area. The intermediate region may also be provided in the IGBT area.

Example Embodiment

Figure 1:
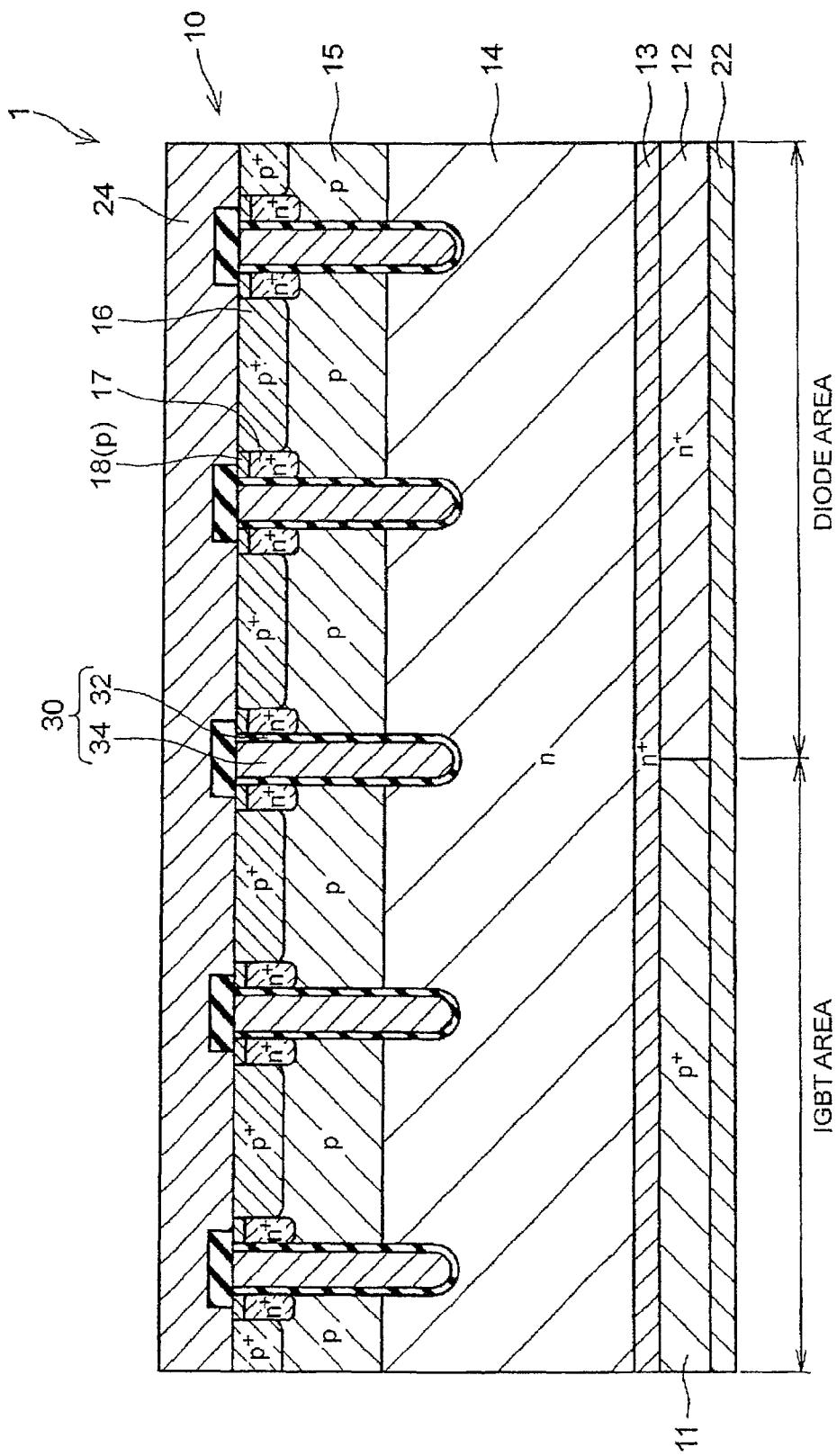
FIG. 1 is a sectional view of the main portions of a reverse conducting IGBT according to one example embodiment of the invention.

As shown in FIG. 1, a reverse conducting IGBT 1 includes a semiconductor layer 10 that is divided into an IGBT area and a diode area, a collector electrode 22 that covers a back surface of the semiconductor layer 10, an emitter electrode 24 that covers a front surface (also referred to simply as "surface") of the semiconductor layer 10, and a plurality of trench gates 30 formed in a surface layer portion of the semiconductor layer 10. Hereinafter, the trench gates 30 and other portions provided in plurality may be referred to in the singular to simplify the description. In one example, aluminum is used as the material of the collector electrode 22, and aluminum is used as the material of the emitter electrode 24. The trench gates 30 each have a trench gate electrode 32 formed of polysilicon, and a gate insulating film 34 formed of silicon oxide that covers the trench gate electrode 32. In one example, the plurality of trench gates 30 are arranged in a stripe when the front surface of the semiconductor layer 10 is viewed from above.

As shown in FIG. 1, the semiconductor layer 10 is a silicon substrate, and includes a $p^+$-type collector region 11, an $n^+$-type cathode region 12, an $n^+$-type buffer region 13, an n-type drift region 14, a p-type body region 15, a $p^+$-type body contact region 16, an $n^+$-type emitter region 17, and a p-type intermediate region 18.

The collector region 11 is provided on a portion of a back layer portion of the semiconductor layer 10. The collector region 11 is provided on a portion below the drift region 14, and is arranged in the IGBT area. The impurity concentration of the collector region 11 is high, and the collector region 11 is ohmically connected to the collector electrode 22. The collector region 11 is formed by introducing boron into a portion of the back layer portion of the semiconductor layer 10 using ion implantation technology, for example.

The cathode region 12 is provided on a portion of the back layer portion of the semiconductor layer 10. Also, the cathode region 12 is provided on a portion below the drift region 14, and is arranged in the diode area. The impurity concentration of the cathode region 12 is high, and the cathode region 12 is ohmically connected to the collector electrode 22. The cathode region 12 is formed by introducing phosphorus into a portion of the back layer portion of the semiconductor layer 10 using ion implantation technology, for example. In this example, one collector region 11 is arranged corresponding to a plurality of trench gates 30, and one cathode region 12 is arranged corresponding to a plurality of trench gates 30, such that the IGBT area and the diode area are clearly divided. This layout is only one example. Instead of this example, any of a variety of layouts may be employed. For example, the layout may also be such that a plurality of the cathode regions 12 are arranged dispersed with respect to the collector region 11.

The buffer region 13 is provided between the collector region 11 and the body region 15, and between the cathode region 12 and the body region 15, and is arranged in both the IGBT area and the diode area. The buffer region 13 is formed by introducing boron from the back surface of the semiconductor layer 10.

The drift region 14 is provided between the buffer region 13 and the body region 15, and is arranged in both the IGBT area and the diode area The drift region 14 contacts a bottom portion of the trench gates 30. The drift region 14 is a remaining portion that forms another region on the semiconductor layer 10, and the impurity concentration is constant in a thickness direction.

The body region 15 is provided on the drift region 14, and is arranged in both the IGBT area and the diode area. The body region 15 contacts side surfaces of the trench gates 30. In other words, the trench gates 30 extend from the surface of the semiconductor layer 10 toward a deep portion of the semiconductor layer 10, pass through the body region 15, and reach the drift region 14. The body region 15 is formed by introducing boron from the front surface of the semiconductor layer 10 using ion implantation technology, for example.

A plurality of the body contact regions 16 are provided on the body region 15, and are arranged in both the IGBT area and the diode area, and are exposed on the surface of the semiconductor layer 10. The impurity concentration of the body contact regions 16 is higher than that of the body region 15, and the body contact regions 16 are ohmically connected to the emitter electrode 24. The body contact regions 16 are formed by introducing boron from the front surface of the semiconductor layer 10 using ion implantation technology, for example.

A plurality of the emitter regions 17 are provided on the body region 15, and are arranged in both the IGBT area and the diode area, and contact the side surfaces of the trench gates 30. The plurality of the emitter regions 17 are formed by introducing phosphorus from the front surface of the semiconductor layer 10 using ion implantation technology, for example.

Figure 2:
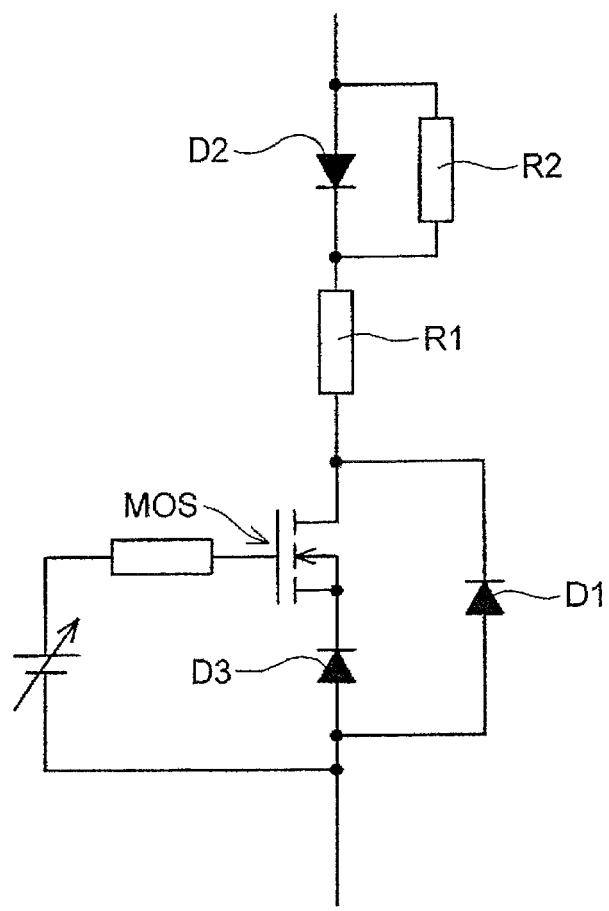
FIG. 2 is a view of an equivalent circuit of the reverse conducting IGBT according to the example embodiment.

A plurality of the intermediate regions 18 are provided on the emitter regions 17, and are arranged in both the IGBT area and the diode area, and contact the side surfaces of the trench gates 30. The plurality of the intermediate regions 18 are interposed between the emitter regions 17 and the emitter electrode 24. Therefore, the emitter regions 17 are separated from the emitter electrode 24 by the intermediate regions 18, and do not contact the emitter electrode 24. The plurality of intermediate regions 18 are formed by introducing boron into a portion of the surface layer portion of the semiconductor layer 10, FIG. 2 is a view of an equivalent circuit of the reverse conducting IGBT 1. A MOS structure is formed by the drift region 14, the body region 15, the emitter region 17 and the trench gate 30. A diode D1 is a pn diode formed between the p-type body region 15 and the n-type drift region 14. In the reverse conducting IGBT 1, the diode D1 operates as a freewheeling diode. A resistor R1 denotes a drift resistor. A diode D2 is a pn diode formed between the p-type collector region 11 and the n-type buffer region 13. A resistor R2 denotes a cathode resistor. The reverse conducting IGBT 1 is characteristic in that it has a diode D3. The diode D3 is a pn diode folioed between the p-type intermediate region 18 and the n-type emitter region 17.

As described in the related art, when return current flows through the diode D1 when the reverse conducting IGBT 1 is used in a three-phase inverter, there is a mode in which gate voltage is applied to the trench gate 30.

For example, in an example in which the intermediate region 18 is not provided, a channel is formed in the entire side surface of the trench gate 30 when gate voltage is applied to the trench gate 30. Therefore, the emitter electrode 24 and the drift region 14 short circuit via this channel, so gate interference in which it is difficult for sufficient voltage to be applied in the forward direction of the diode D1 formed by the body region 15 and the drift region 14 strongly appears.

Figure 3:
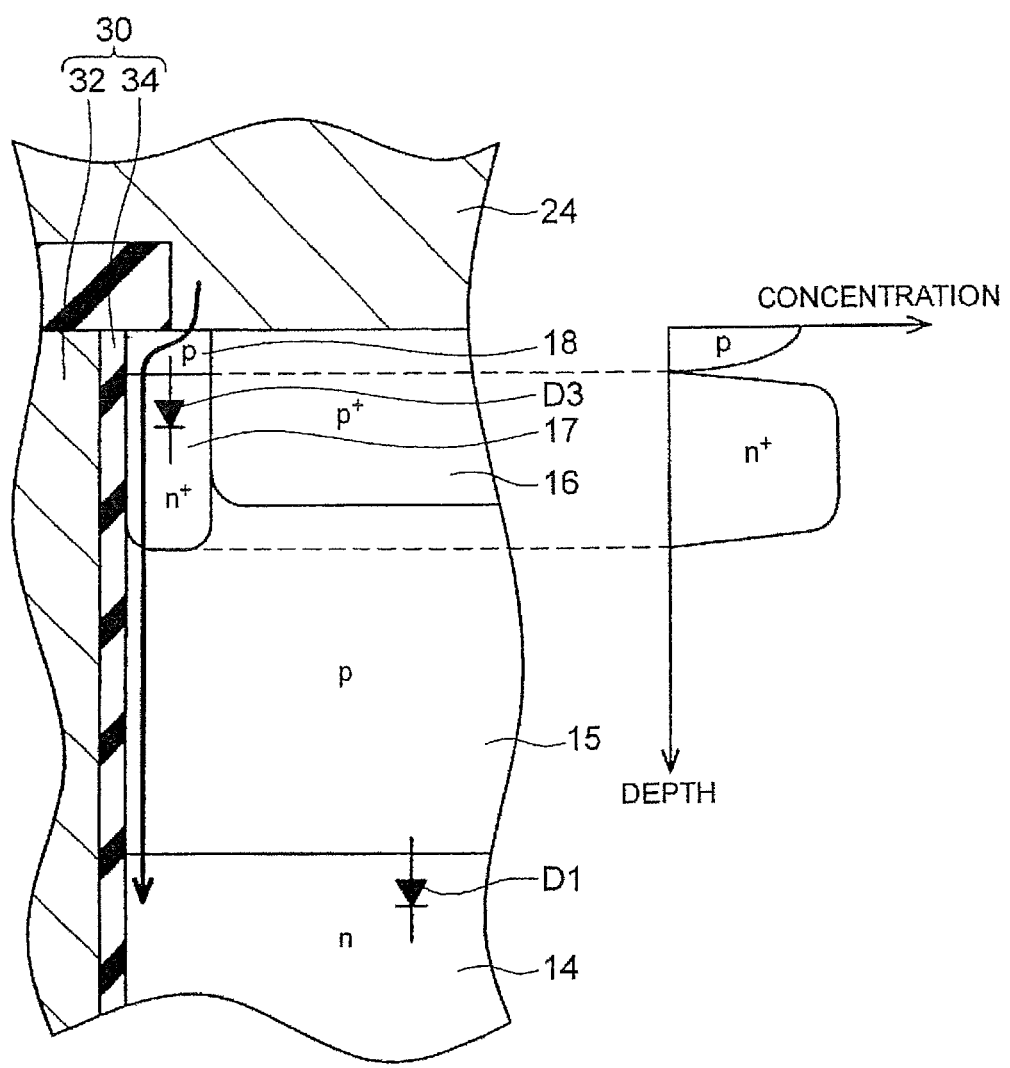
FIG. 3 is an enlarged sectional view of the main portions around an intermediate region of the reverse conducting IGBT according to the example embodiment.

However, with the reverse conducting IGBT 1 in this example embodiment, the diode D3 is formed between the intermediate region 18 and the emitter region 17, as shown in FIG. 3. Therefore, when electronic current flows through the channel in the side surface of the trench gate 30, this electronic current passes through this diode D3. In other words, the channel in the side surface of the trench gate 30 is not directly connected to the emitter electrode 24, but is instead connected to the emitter electrode 24 via the diode D3. Therefore, forward voltage is applied to the diode D1 embedded between the body region 15 and the drift region 14 by a voltage drop of the diode D3, due to the electronic current flowing through the diode D3. Accordingly, with the reverse conducting IGBT 1 in this example embodiment, even if gate voltage is applied to the trench gate 30, forward voltage will be applied to the diode D1 without the emitter electrode 24 and the drift region 14 shorting, so return current is able to flow well. In this way, gate interference is able to be reduced with the reverse conducting IGBT 1.

Also, as shown in FIG. 3, with the reverse conducting IGBT 1 in this example embodiment, the impurity concentration of the intermediate region 18 is low and the thickness of the intermediate region 18 is also thin. More specifically, the impurity concentration of the intermediate region 18 is lower than the impurity concentration of the emitter region 17, and the thickness of the intermediate region 18 is thinner than the thickness of the emitter region 17. When the IGBT structure turns on, the intermediate region 18 in this kind of mode becomes depleted by a depletion layer that extends from the boundary between the emitter region 17 and the intermediate region 18, due to the diode D3 being inversely-biased, and consequently the intermediate region 18 punches through. Therefore, when the IGBT structure turns on, the diode D3 between the emitter region 17 and the intermediate region 18 essentially disappears, and may be regarded as equivalent to a simple resistor. Accordingly, current that flows through the IGBT structure is unimpeded. As a result, an on-operation of the IGBT structure is able to be inhibited from being impeded.

With the reverse conducting IGBT 1 in this example embodiment, the intermediate region 18 is provided in both the diode area and the IGBT area. For example, the reverse conducting IGBT 1 is still able to display the effect of inhibiting gate interference even if the intermediate region 18 is provided only in the diode area. However, providing the intermediate region 18 in both the diode area and the IGBT area enables gate interference to be even further reduced.

With the reverse conducting IGBT 1 in this example embodiment, an example in which a silicon substrate is used for the semiconductor layer 10 is given, but the semiconductor material of the semiconductor layer 10 is not particularly limited. For example, the semiconductor material of the semiconductor layer 10 may also be silicon carbide, gallium nitride, aluminum nitride, or diamond.

Figure 4:
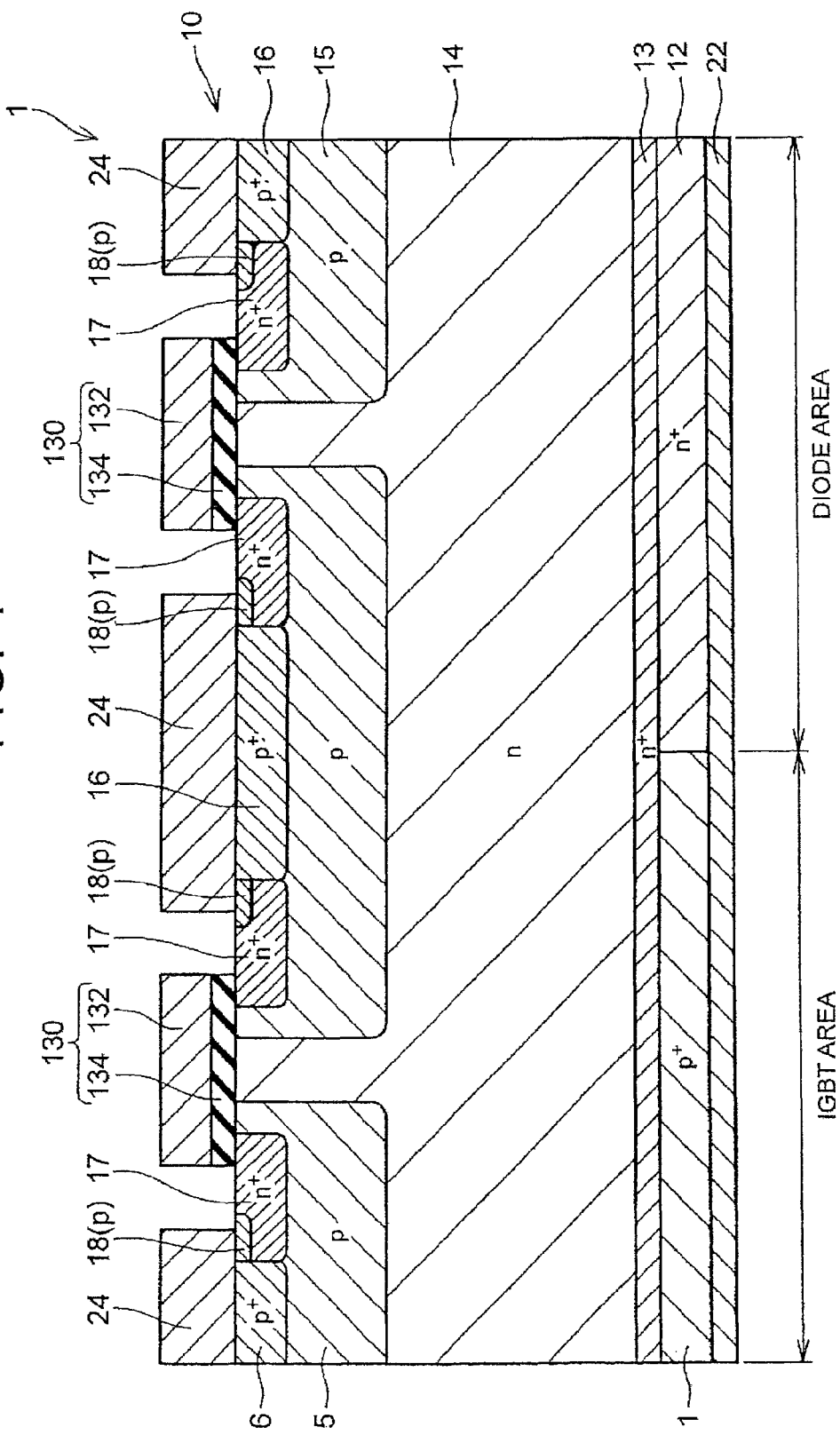
FIG. 4 is a sectional view of the main portions of a reverse conducting IGBT according to a modified example of the example embodiment of the invention.
Figure 5:
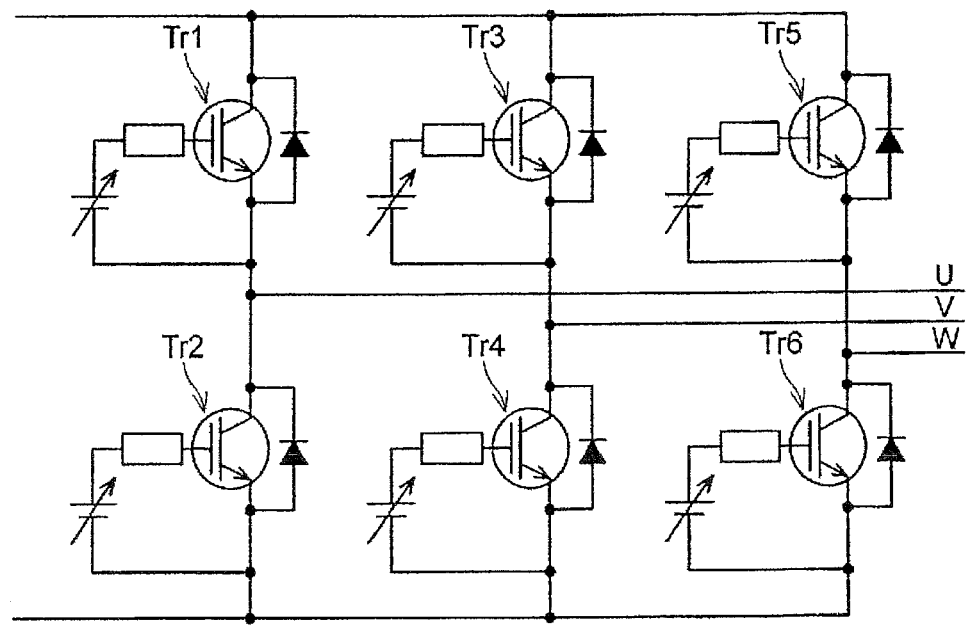
FIG. 5 is diagram of a circuit structure of an inverter circuit.
Figure 6:
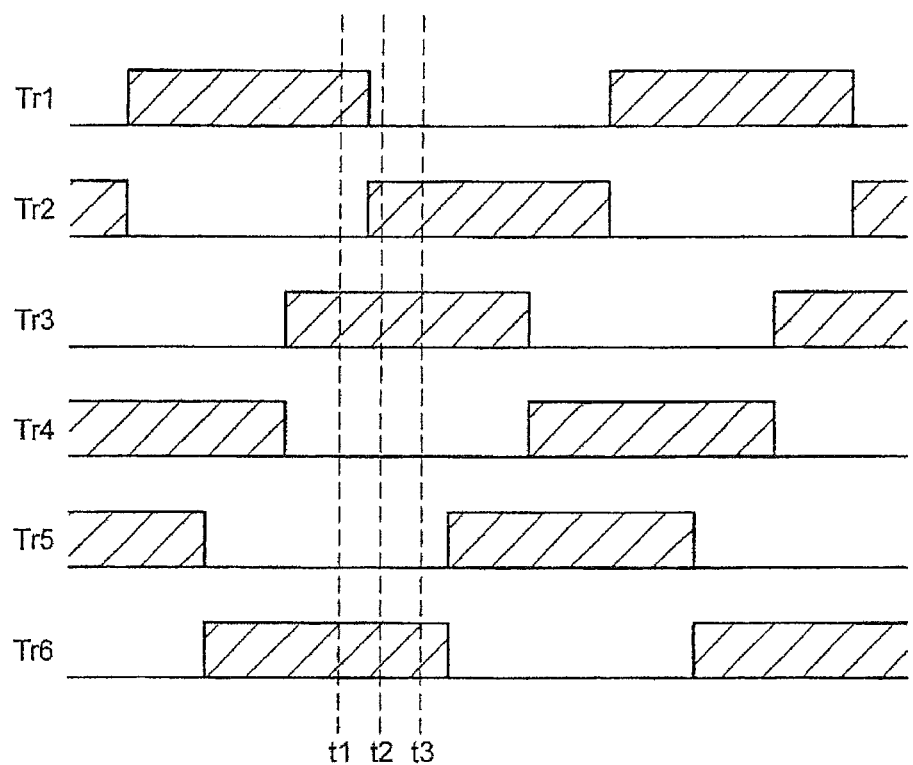
FIG. 6 is a timing chart of gate signals with respect to transistors that form the inverter circuit.
Figure 7:
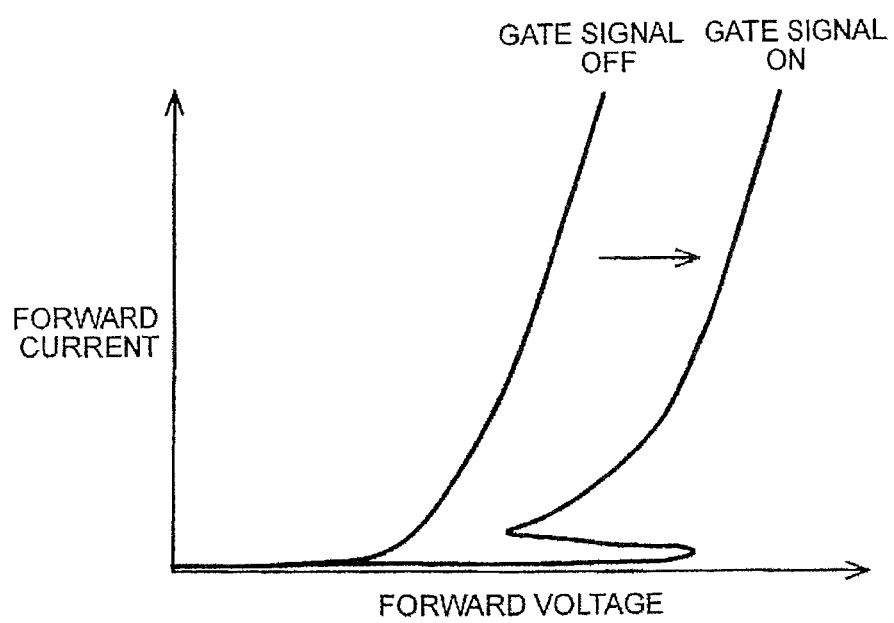
FIG. 7 is a view illustrating the effect of gate interference in forward current and forward voltage of a diode structure included in the reverse conducting IGBT.

Also, an insulated gate of the reverse conducting IGBT 1 may be a planar gate 130 that has a planar gate electrode 132 formed of polysilicon, and a gate insulating film 134 formed of silicon oxide, as shown in FIG. 4. In this example as well, a pn diode is formed between the p-type intermediate region 18 and the n-type emitter region 17, and forward voltage is applied to the diode embedded between the body region 15 and the drift region 14 by a voltage drop of this diode, so gate interference is able to be reduced.

What is claimed is:

1. A reverse conducting IGBT comprising:
   an insulated gate;
   a semiconductor layer having a first conductivity type drift region, a second conductivity type body region, a first conductivity type emitter region, and a second conductivity type intermediate region; and
   an emitter electrode provided on a surface of the semiconductor layer,
   the first conductivity type drift region of the semiconductor layer contacting the insulated gate, the second conductivity type body region of the semiconductor layer being provided on the drift region and contacting the insulated gate, the first conductivity type emitter region of the semiconductor layer being provided on the body region and contacting the insulated gate, and the second conductivity type intermediate region of the semiconductor layer being provided on the emitter region and being interposed between the emitter region and the emitter electrode.

2. The reverse conducting IGBT according to claim 1, wherein
   the intermediate region is configured to punch through when the intermediate region and the emitter region are inversely-biased.

3. The reverse conducting IGBT according to claim 1, wherein
   an impurity concentration of the intermediate region is lower than an impurity concentration of the emitter region.

4. The reverse conducting IGBT according to claim 1, further comprising:
   a second conductivity type collector region provided on one portion below the drift region in the semiconductor layer; and
   a first conductivity type cathode region provided on another portion below the drift region in the semiconductor layer.

5. The reverse conducting IGBT according to claim 4, wherein
   when an area where the collector region is present is an IGBT area and an area where the cathode region is present is a diode region when the semiconductor layer is viewed from above, the intermediate region is provided in at least the diode area.

6. The reverse conducting IGBT according to claim 5, wherein
   the intermediate region is also provided in the IGBT area.

7. The reverse conducting IGBT according to claim 1, wherein
   the insulated gate has a trench gate that extends from the surface of the semiconductor layer toward a deep portion of the semiconductor layer.

* * * * *